(12) United States Patent
Xie

(10) Patent No.: US 10,297,664 B2
(45) Date of Patent: May 21, 2019

(54) NANOSHEET TRANSISTOR WITH UNIFORM EFFECTIVE GATE LENGTH

(71) Applicant: GLOBALFOUNDRIES INC., Grand Cayman (KY)

(72) Inventor: Ruilong Xie, Schenectady, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 5 days.

(21) Appl. No.: 15/486,351

(22) Filed: Apr. 13, 2017

(65) Prior Publication Data
US 2018/0301531 A1    Oct. 18, 2018

(51) Int. Cl.
*H01L 29/06* (2006.01)
*H01L 29/66* (2006.01)
*H01L 21/02* (2006.01)
*H01L 29/165* (2006.01)
*H01L 29/08* (2006.01)

(52) U.S. Cl.
CPC .... *H01L 29/0673* (2013.01); *H01L 21/02532* (2013.01); *H01L 29/0847* (2013.01); *H01L 29/165* (2013.01); *H01L 29/66545* (2013.01); *H01L 29/66742* (2013.01)

(58) Field of Classification Search
CPC .............. H01L 29/0673; H01L 29/165; H01L 29/0847; H01L 29/66545; H01L 29/66742; H01L 21/02532
See application file for complete search history.

(56) References Cited

U.S. PATENT DOCUMENTS

| | | | |
|---|---|---|---|
| 9,196,479 B1 * | 11/2015 | Cheng | H01L 21/823807 |
| 10,068,920 B2 * | 9/2018 | Reznicek | H01L 27/1211 |
| 2014/0209864 A1 | 7/2014 | Bangsaruntip et al. | |
| 2016/0240534 A1 | 8/2016 | Murthy et al. | |
| 2017/0301697 A1 * | 10/2017 | Reznicek | H01L 27/1211 |

* cited by examiner

*Primary Examiner* — Seahvosh Nikmanesh
(74) *Attorney, Agent, or Firm* — David Cain; Hoffman Warnick LLC

(57) ABSTRACT

A method of forming nanosheet and nanowire transistors includes the formation of alternating epitaxial layers of silicon germanium (SiGe) and silicon (Si), where the germanium content within respective layers of the silicon germanium is systemically varied in order to mediate the selective etching of these layers. The germanium content can be controlled such that voids created by removal of the silicon germanium have uniform dimensions, and the back-filling of such voids with gate dielectric and gate conductor layers proximate to silicon nanosheets or nanowires results in devices having a uniform effective gate length.

18 Claims, 13 Drawing Sheets

NANOSHEET TRANSISTOR WITH UNIFORM EFFECTIVE GATE LENGTH

BACKGROUND

The present application relates generally to semiconductor devices, and more specifically to vertically-stacked nanosheet or nanowire transistors and their methods of production.

A nanosheet or a nanowire field effect transistor (FET) includes plural layers of nano-dimensional semiconductor material that function as the channel regions of the device. Such nanosheet- or nanowire-based structures enable feature scaling beyond current two-dimensional CMOS technology. However, conventional fabrication methods that use alternating sacrificial layers to offset the active nanostructures with respect to one another as well as template their growth may yield undesirable variation in the length of the channel region amongst the various active layers. Such variation can result from geometric effects associated with patterning and etching a stack of layers.

Shown in FIG. 1, for example, is an TEM micrograph of a comparative nanowire transistor at an intermediate stage of fabrication. The device includes a semiconductor substrate 10 with an array of alternately stacked layers 20, 30 formed thereon. The array of layers includes sacrificial silicon germanium (SiGe) layers 20 and active silicon (Si) layers 30. During subsequent fabrication, the sacrificial layers 20 of silicon germanium are removed and replaced with a gate all around (GAA) architecture that includes gate dielectric and gate conductor layers (not shown). However, as will be appreciated, the length (LG1, LG2, LG3) of the sacrificial silicon germanium layers 20 is not uniform throughout the device, which results in non-uniformity in the effective gate length after formation of the gate layers. Such gate length non-uniformity may adversely affect the performance and reliability of the device.

SUMMARY

Disclosed is a method for forming a nanosheet or nanowire FET having a uniform effective gate length. In nanosheet and nanowire devices, the gate length may be effected by the gate profile, the profile of a source/drain recess etch and/or etching of the sacrificial SiGe layers and the accompanying formation of inner spacers. As disclosed herein, uniform etch back of the sacrificial SiGe layers and the attendant realization of a more consistent gate length amongst the exposed semiconductor nanostructures may be achieved by offsetting the etch effects that contribute to a non-uniform etch profile with layer-specific variations in composition. Thus, various embodiments contemplate the use of compositional control to modulate the etch rate of individual ones of various sacrificial layers.

In accordance with embodiments of the present application, a method of fabricating a device includes forming a stack of alternating layers of epitaxial silicon germanium and epitaxial silicon over a semiconductor substrate, patterning the stack to form a fin, and forming a sacrificial gate structure over the fin. The layers of epitaxial silicon germanium are formed such that each successive layer of silicon germanium has a germanium content that is less than that of a previously-formed layer of silicon germanium.

Further methods for fabricating a device include forming a stack of alternating layers of epitaxial silicon germanium and epitaxial silicon over a semiconductor substrate, such that each successive layer of silicon germanium has a germanium content that is 2 to 5 atomic percent less than that of an underlying, previously-formed layer of silicon germanium.

According to further embodiments, a device includes plural channel regions each including a silicon portion having a first distal end and a second distal end disposed over a semiconductor substrate, where the channel regions have substantially equal length and are each circumferentially surrounded by a respective gate structure. A source region including a doped silicon portion extends from each first distal end, and a drain region including a doped silicon portion extends from each second distal end.

The source regions extending from the first distal ends are configured to have substantially unequal lengths, and the drain regions extending from the second distal ends are configured to have substantially unequal lengths. In certain embodiments, the length of the source regions and the drain regions decreases with increased distance from the substrate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
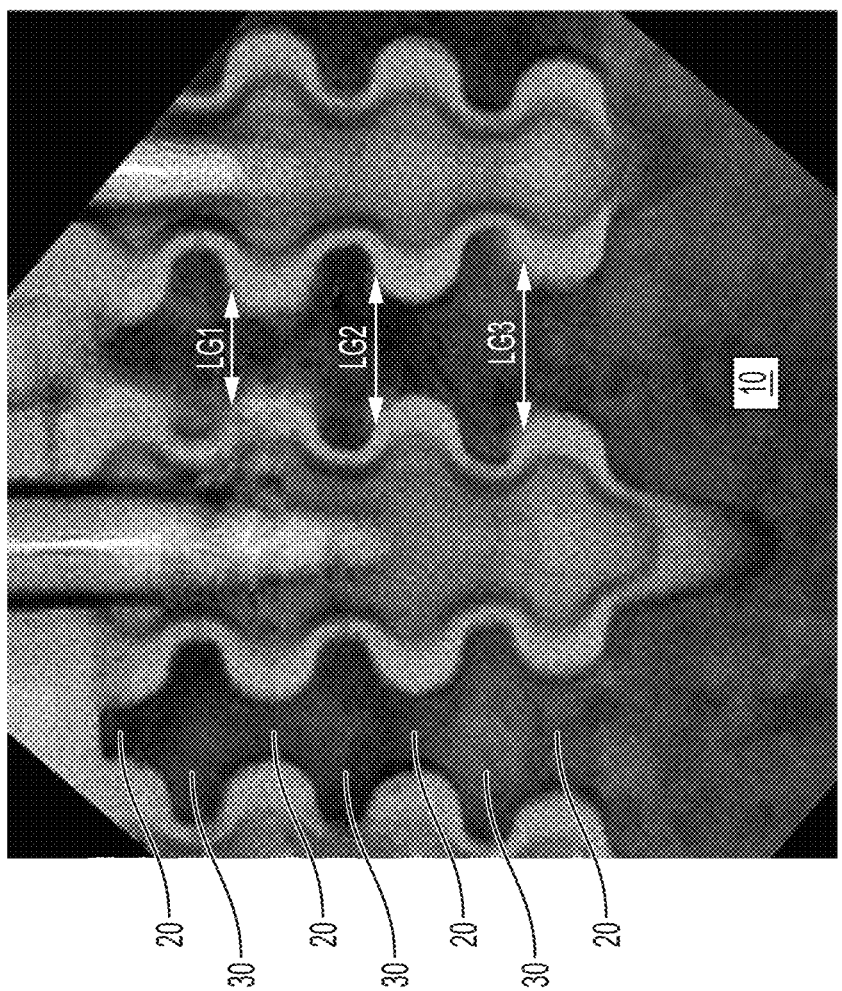
FIG. 1 is a cross-sectional scanning electron microscope (SEM) micrograph showing a comparative nanosheet FET having a variable effective gate length over plural layers of the device.

Reference will now be made in greater detail to various embodiments of the subject matter of the present application, some embodiments of which are illustrated in the accompanying drawings. The same reference numerals will be used throughout the drawings to refer to the same or similar parts.

Disclosed are methods for forming a nanosheet or nanowire field effect transistor as well as a resulting nanostructure device. Gate all around (GAA) nanostructure channel transistors such as nanosheet and nanowire FETs enable feature scaling beyond current two-dimensional CMOS technology. Such devices include source and drain regions, and stacked nanostructured channel regions disposed therebetween. A gate, including a gate dielectric and a gate conductor, surrounds the stacked nano-dimensional channels and controls electron flow through the channels between the source and drain regions.

Nanosheet and nanowire devices can be formed from alternating epitaxial layers of an active semiconductor material such as silicon (Si) using sacrificial semiconductor material layers such as silicon germanium (SiGe) layers as templates for epitaxial growth and as inter-layer spacers. However, the three-dimensional geometry associated with multiple layers if disparate composition can challenge achieving a uniform removal rate of the sacrificial layers, which may lead to inconsistencies in the gate lengths associated with active layers.

Accordingly, the present disclosure provides fabrication methodologies and resulting devices for stacked nanosheet and nanowire transistors having improved effective gate length uniformity throughout a device comprising plural active layers. As used herein, a "nanowire" device is characterized by a channel having a critical dimension (CD) of less than 30 nm, while a "nanosheet" device is characterized by a channel having a critical dimension of 30 nm or greater. In exemplary devices, the critical dimension is measured along the gate. In that direction, if the width of the GAA channel is small, the channel cross-section is like a "wire" whereas if the width of the GAA channel is large, the channel cross-section is like a "sheet." As will be appreciated, the presently disclosed methods may be incorporated into the manufacture of nanosheet as well as nanowire devices.

In one or more embodiments, the device fabrication methodology includes processes and materials that counteract geometrically-driven variability in the etch profile of the sacrificial layers, which can result in a more uniform effective gate length. In several embodiments, the composition of the SiGe layers used as sacrificial layers is systematically controlled throughout the Si/SiGe stack in order to tailor the etch rate of each SiGe layer, which can be used to offset the local geometric etch effects.

An exemplary process flow is described herein with reference to FIGS. 2-12. As shown in FIGS. 2A and 2B, alternating sacrificial epitaxial layers 201L, 202L, 203 L, 204L and semiconductor epitaxial layers 301L, 302L, 303L are formed as a stack over a substrate 100.

The substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer (e.g., buried oxide layer), and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, the stack of epitaxial layers is configured such that a first sacrificial layer 201L is formed directly over the substrate 100, followed by alternating semiconductor and sacrificial layers. In various embodiments, the epitaxial stack terminates with a sacrificial layer, such that each semiconductor layer 301L, 302L, 303L is sandwiched between an underlying and an overlying sacrificial layer. For simplicity of illustration, four sacrificial layers 201L, 202L, 203L, 204L and three semiconductor layers 301L, 302L, 303L are shown. However, fewer or greater sacrificial layers and/or semiconductor layers may for formed by epitaxial growth in an alternating fashion over substrate 100. In example embodiments, the as-deposited semiconductor layers 301L, 302L, 303L are undoped.

The terms "epitaxy," "epitaxial" and/or "epitaxial growth and/or deposition" refer to the formation of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material will adopt the same crystalline characteristics as the deposition surface on which it is formed. For example, an epitaxial semiconductor material deposited on a (100) crystal surface will take on a (100) orientation.

In the instant method, sacrificial layers 201L, 202L, 203L, 204L serve as spacer layers that offset the semiconductor layers 301L, 302L, 303L from each other. The sacrificial layers 201L, 202L, 203L, 204L also serve as template layers upon which the semiconductor layers can be grown epitaxially.

Epitaxial layers (i.e., the sacrificial layers and the semiconductor layers) may be formed by a reduced pressure molecular beam epitaxy (MBE) or a chemical vapor deposition (CVD) process, for example, at a substrate temperature of 450-700° C. and a growth pressure (i.e., chamber pressure) of 0.1-700 Torr. A source of silicon may include silane gas ($SiH_4$), and a germanium source for the $SiGe_x$ epitaxy may include germane gas ($GeH_4$). Hydrogen may be used as a carrier gas.

According to various embodiments, a first silicon germanium ($SiGe_x$) layer 201L is epitaxially grown on a semiconductor substrate 100. During an exemplary process, a silicon precursor (e.g., silane) flows concurrently into a process chamber with a carrier gas (e.g., $H_2$ and/or $N_2$) and a germanium source (e.g., $GeH_4$). By way of example, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used.

As will be appreciated, other suitable gas sources for silicon include silicon tetrachloride ($SiCl_4$), dichlorosilane ($SiH_2Cl_2$), trichlorosilane ($SiHCl_3$), and other hydrogen-reduced chlorosilanes ($SiH_xCl_{4-x}$). In lieu of germane, other germanium sources or precursors may be used to form epitaxial silicon germanium layers. Higher germanes include the compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds with the empirical formula $R_yGe_xH_{(2x+2-y)}$, where R=methyl, ethyl, propyl or butyl, such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$).

The process chamber may be maintained at a pressure of 0.1 Torr to 700 Torr, while the substrate 100 is maintained at a temperature in the range of 450° C. to 700° C. The process according to certain embodiments is conducted to form an initial SiGe layer with a thickness in a range of 5 to 20 nm. The germanium content of the first silicon germanium ($SiGe_x$) layer 201L may be in the range of 25 to 50 atomic percent. According to various embodiments, the first silicon germanium layer 201L is compositionally homogeneous.

Following deposition of the first silicon germanium layer 201L, a first epitaxial silicon layer 301L is formed directly over the first silicon germanium layer 201L. According to an example method, during deposition of the first silicon layer 301L, a silicon precursor (e.g., silane) is flown concurrently into the process chamber with a carrier gas (e.g., $H_2$ and/or $N_2$). The flow rate of the silane may be in the range of 5 sccm to 500 sccm, and the flow rate of the carrier gas may be in the range of 1,000 sccm to 60,000 sccm, although lesser and greater flow rates may be used.

The process chamber for deposition of the silicon layer 301L may be maintained at a pressure of 0.1 Torr to 700 Torr, while the substrate 100 is maintained at a temperature in the range of 450° C. to 700° C. The process according to certain embodiments is conducted to form a first silicon layer 301L with a thickness in a range from 5 to 20 nm.

Following deposition of the first epitaxial silicon layer 301L, according to the illustrated embodiment, alternating silicon germanium and silicon process conditions are used to successively deposit a second epitaxial silicon germanium layer 202L directly over the first epitaxial silicon layer 301L, a second epitaxial silicon layer 302L directly over the second epitaxial silicon germanium layer 202L, a third epitaxial silicon germanium layer 203L directly over the second epitaxial silicon layer 302L, a third epitaxial silicon layer 303L directly over the third epitaxial silicon germanium layer 203L, and a fourth epitaxial silicon germanium layer 204L directly over the third epitaxial silicon layer 303L.

The process materials and conditions used to form the second and third silicon layers 302L, 303L may be the same process materials and conditions used to form the first silicon layer 301L. However, the process materials and conditions used to form the second, third and fourth silicon germanium layers 202L, 203L, 204L may be adjusted in order to change the germanium composition within each successive layer. That is, although each respective silicon germanium layer 201L, 202L, 203L, 204L may itself be compositionally homogeneous, the germanium content within each layer decreases for each successive layer over the substrate.

In certain embodiments, the sacrificial silicon germanium layers may have a germanium content of 20 to 50 atomic percent. In certain embodiments, the germanium content between consecutive silicon germanium layers may independently decrease by an amount of from 1 to 5 at. %, e.g., 1, 2, 3, 4, or 5 atomic percent per layer. By way of example, the first silicon germanium layer 201L may comprise 35 at. % germanium, the second silicon germanium layer 202L may comprise 33 at. % germanium, the third silicon germanium layer 203L may comprise 31 at. % germanium, and the fourth silicon germanium layer 204L may comprise 29 at. % germanium. By way of a further example, the first silicon germanium layer 201L may comprise 50 at. % germanium, the second silicon germanium layer 202L may comprise 49 at. % germanium, the third silicon germanium layer 203L may comprise 47 at. % germanium, and the fourth silicon germanium layer 204L may comprise 44 at. % germanium. By way of a still further example, the first silicon germanium layer 201L may comprise 50 at. % germanium, the second silicon germanium layer 202L may comprise 45 at. % germanium, the third silicon germanium layer 203L may comprise 40 at. % germanium, and the fourth silicon germanium layer 204L may comprise 35 at. % germanium.

In various methods, the formation of SiGe epitaxial layers having such an intralayer compositional gradient may achieved by maintaining a constant partial pressure (e.g., flow rate) of the silicon precursor during each SiGe process, while decreasing the partial pressure (e.g., flow rate) of the germanium precursor.

In alternate methods, the formation of the SiGe epitaxial layers may achieved by maintaining a constant partial pressure (e.g., flow rate) of the germanium precursor during each SiGe process, while increasing the partial pressure (e.g., flow rate) of the silicon precursor.

Thus, in various embodiments, the composition of the semiconductor layers 301L, 302L, 303L, etc. may be constant over the stack, whereas the composition of the sacrificial layers 201 L, 202L, 203L, 204L, etc. varies systematically such that the germanium content decreases with each successively-deposited layer of SiGe.

In various embodiments, the thickness amongst the respective sacrificial SiGe layers and amongst the semiconductor layers may be constant, while the sacrificial SiGe layers are thinner than the semiconductor layers. In alternate embodiments, the thickness amongst the respective sacrificial SiGe layers and amongst the semiconductor layers may be constant, while the sacrificial SiGe layers are thicker than the semiconductor layers.

Figure 2A:
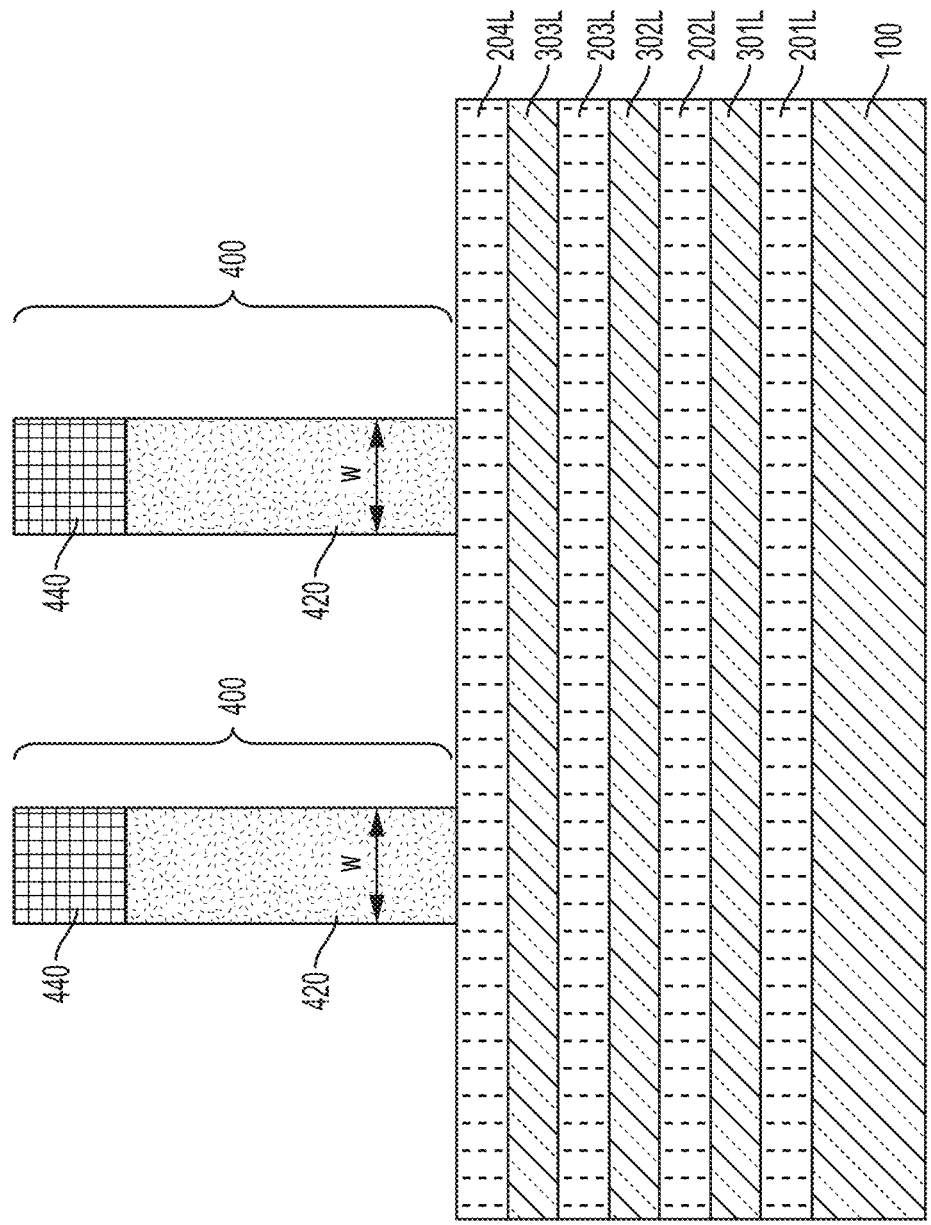
FIG. 2A is a cross-sectional schematic view of a structure showing the formation of sacrificial gate structures over a stack comprising alternating epitaxial layers of silicon germanium and silicon according to various embodiments.
Figure 2B:
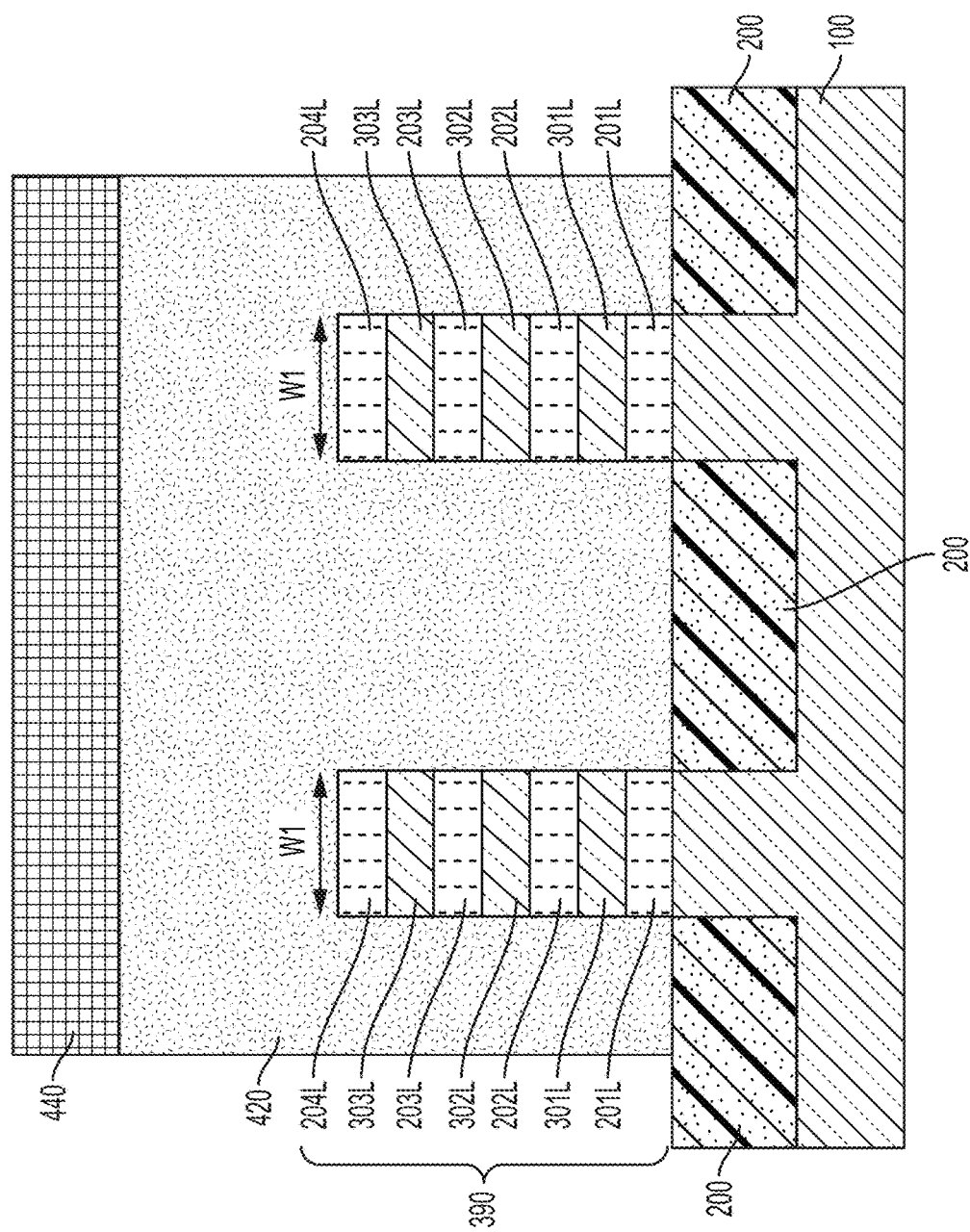
FIG. 2B is a cross-sectional schematic view taken orthogonal to the structure of FIG. 2A showing a fin structure composed of the alternating epitaxial layers of silicon germanium and silicon.

Referring still to FIGS. 2A and 2B, a sacrificial gate structure 400 comprising a sacrificial gate layer 420 and a sacrificial gate cap 440 is formed over the substrate 100, i.e., directly over the stack of epitaxial layers, using patterning and etching processes known to those skilled in the art. The sacrificial gate layer 420 may comprise a layer of silicon dioxide and amorphous silicon (a-Si), for example, and the sacrificial gate cap 440 may comprise silicon nitride. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition.

Sacrificial gate structures 400 may be defined by a patterning process such as photolithography, for example, which includes forming a layer of photoresist material (not shown) atop one or more layers to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the sacrificial gate cap layer 440 and the sacrificial gate layer 420 utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

The sacrificial gate layer 420 may be patterned to a width (w) of 15 to 25 nm and have a height of 50 to 200 nm, e.g., 50, 75, 100, 125, 150, 175 or 200 nm, including ranges between any of the foregoing values, although lesser and greater widths and thicknesses may be used. Referring to FIG. 2B, a shallow trench isolation layer 200 may provide electrical isolation between adjacent fin structures, as known to those skilled in the art.

Figure 3:
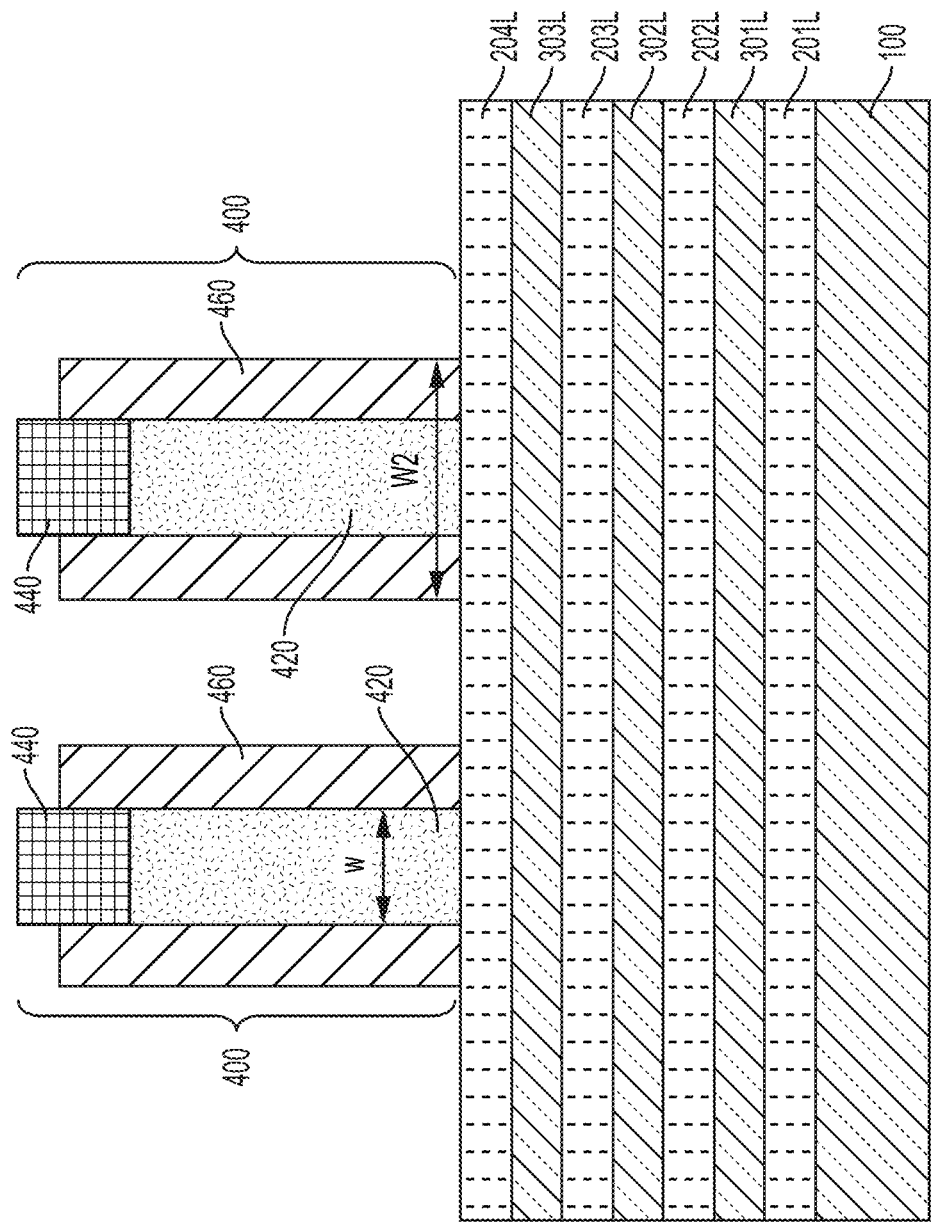
FIG. 3 depicts the formation of sidewall spacers over the sacrificial gate structures of FIG. 2A.

Referring to FIG. 3, sidewalls spacers 460 are formed over sidewalls (vertical surfaces) of the sacrificial gate structures 400. Sidewall spacers 460 may be formed by blanket (conformal) deposition of a spacer material (e.g., using an atomic layer deposition process), followed by a directional etch such as reactive ion etching (RIE) to remove the spacer material from horizontal surfaces. In certain embodiments, the sidewall spacer thickness is 5 to 20 nm, e.g., 5, 10, 15 or 20 nm, including ranges between any of the foregoing values.

Suitable sidewall spacer materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon dioxide.

Exemplary low-k materials include but are not limited to, amorphous carbon, fluorine-doped oxides, or carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™.

In various embodiments, the sidewall spacers 460 and the sacrificial gate 420 are formed from materials that can be etched selectively to one another. In particular embodiments, the sacrificial gate 420 comprises amorphous silicon (a-Si) and the sidewall spacers 460 comprises silicon nitride or SiOCN.

Figure 4:
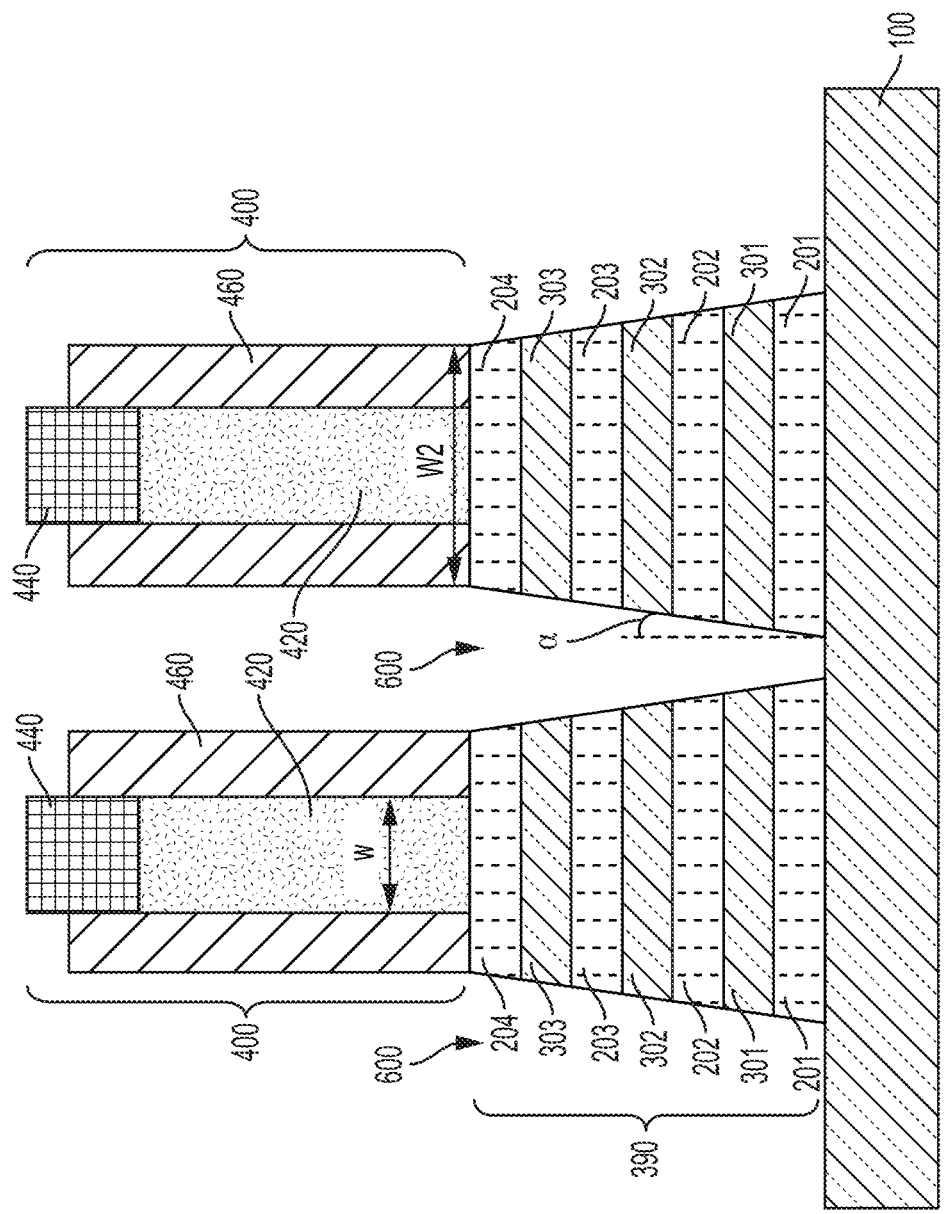
FIG. 4 shows a self-aligned source/drain recess etch of the epitaxial layers adjacent to the sacrificial gate structures.

As will be appreciated, the patterning of the sacrificial gate structures 400 overlies composite fin-shaped structures 390, which will be used to form the channel regions of a semiconductor device. Referring to FIG. 4, using the sacrificial gate 400 and sidewall spacers 460 as an etch mask, fin structures 390 are further defined, i.e., along the width direction of the sacrificial gate 420 by etching and removing unmasked portions of the epitaxial layers. The etching may comprise a silicon RIE process, for example. The fin structures 390 may have a width (W1) measured orthogonal to the gate width (w) of 6 to 100 nm, e.g., 6, 10, 20, 50, 75 or 100 nm, and a width (W2) measured parallel to the gate width (w) of 25 to 65 nm, e.g., 25, 30, 35, 40, 45, 50, 55, 60 or 65 nm, including ranges between any of the respective foregoing values. In various embodiments, sidewalls of the resulting fin structures 390 may deviate from vertical (i.e., deviate from a direction orthogonal to a major surface of the substrate) by a taper angle ($\alpha$), where $0<\alpha \leq 15°$.

In accordance with the illustrated embodiment, removed portions of the epitaxial stack create source/drain recesses 600 laterally adjacent to the sacrificial gate structure 400. As described in greater detail herein below, portions of the remaining stack defined by nanoscale silicon layers 301, 302, 303, once released from the sacrificial SiGe layers 201, 202, 203, 204, will form channels of a nanosheet or nanowire FET.

Figure 5:
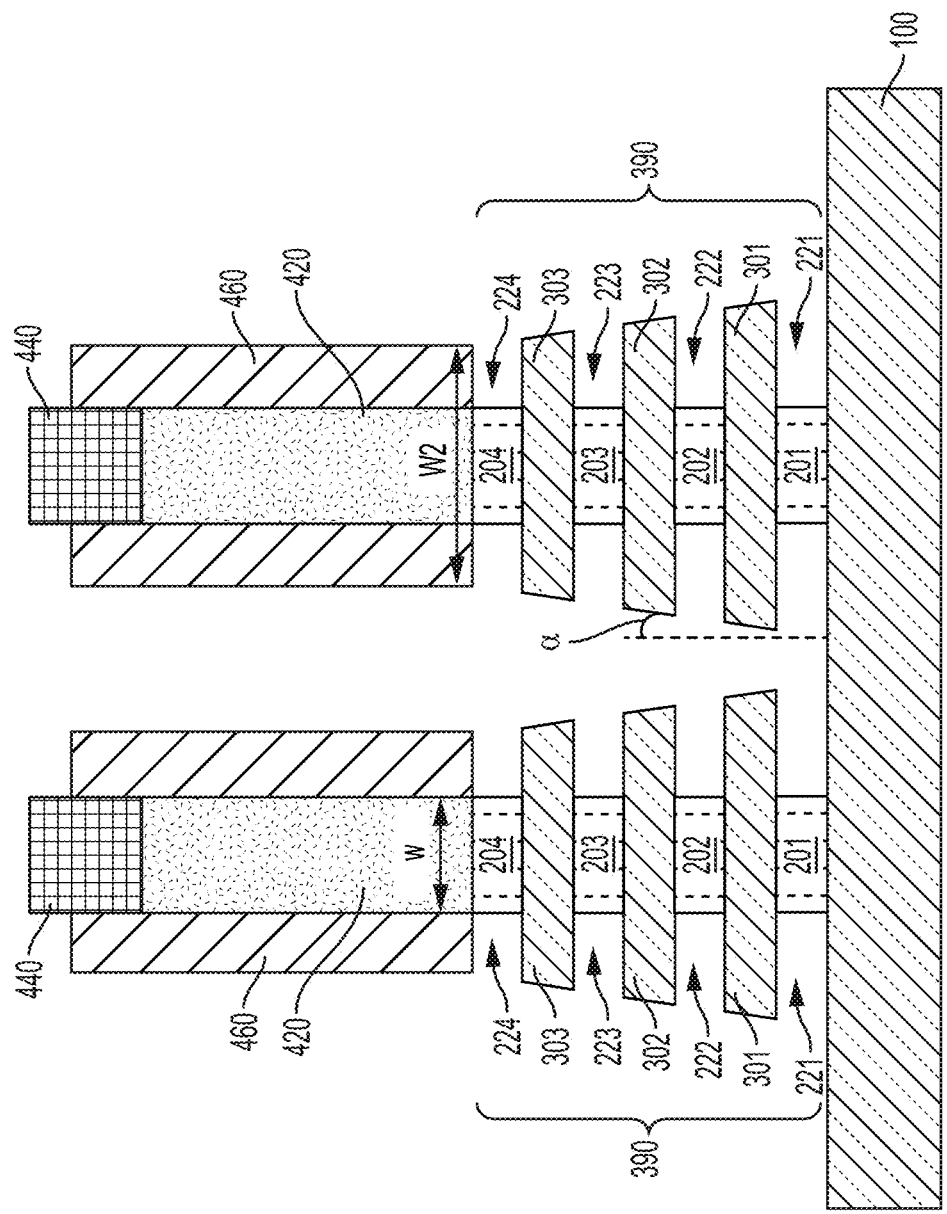
FIG. 5 depicts a lateral recess etch of the silicon germanium epitaxial layers.

Then, referring to FIG. 5, sacrificial layers 201, 202, 203, 204 are recessed laterally beneath the sidewall spacers 460 using a selective isotropic etch, such as a hydrogen chloride (HCl)-based wet etch or a wet mixture comprising acetic acid ($CH_3COOH$), hydrogen peroxide ($H_2O_2$) and hydrofluoric acid (HF), to form corresponding recessed regions 221, 222, 223, 224. The selective etch removes SiGe, for example, without etching silicon. As illustrated, the recess etch may result in remaining portions of the sacrificial layers 201, 202, 203, 204 having a substantially equal width, which may be equal to the width (w) of the sacrificial gate layer 420. As will be appreciated, the starting widths of respective ones of the sacrificial layers 201, 202, 203, 203 may be unequal due to the taper associated with the fin etch described with reference to FIG. 4. In addition to, or in lieu of, a taper-driven geometric effect, the aspect ratio of the remaining fin structures 390 and the overlying sacrificial gate structure 400 together with a relatively narrow spacing between adjacent sidewall spacers 460 may contribute to differences in the relative etch rates of SiGe layers at the top of the fins structures 390 versus at the bottom of the fin structures.

However, as disclosed herein, the variation in composition amongst respective ones of the sacrificial layers 201, 202, 203, 204 can be used to offset the geometric or shadowing effects to produce sacrificial layers 201, 202, 203, 204 having a substantially equal width following the recess etch. As used herein, "substantially equal" dimensions vary by less than 5%, e.g., 0, 1, 2, 3, 4 or 5%, including ranges between any of the foregoing values. In various embodiments, the relative etch rate (R) during the recess etch of the sacrificial layers 201, 202, 203, 204 may be characterized as R(201)>R(202)>R(203)>R(204).

Figure 6:
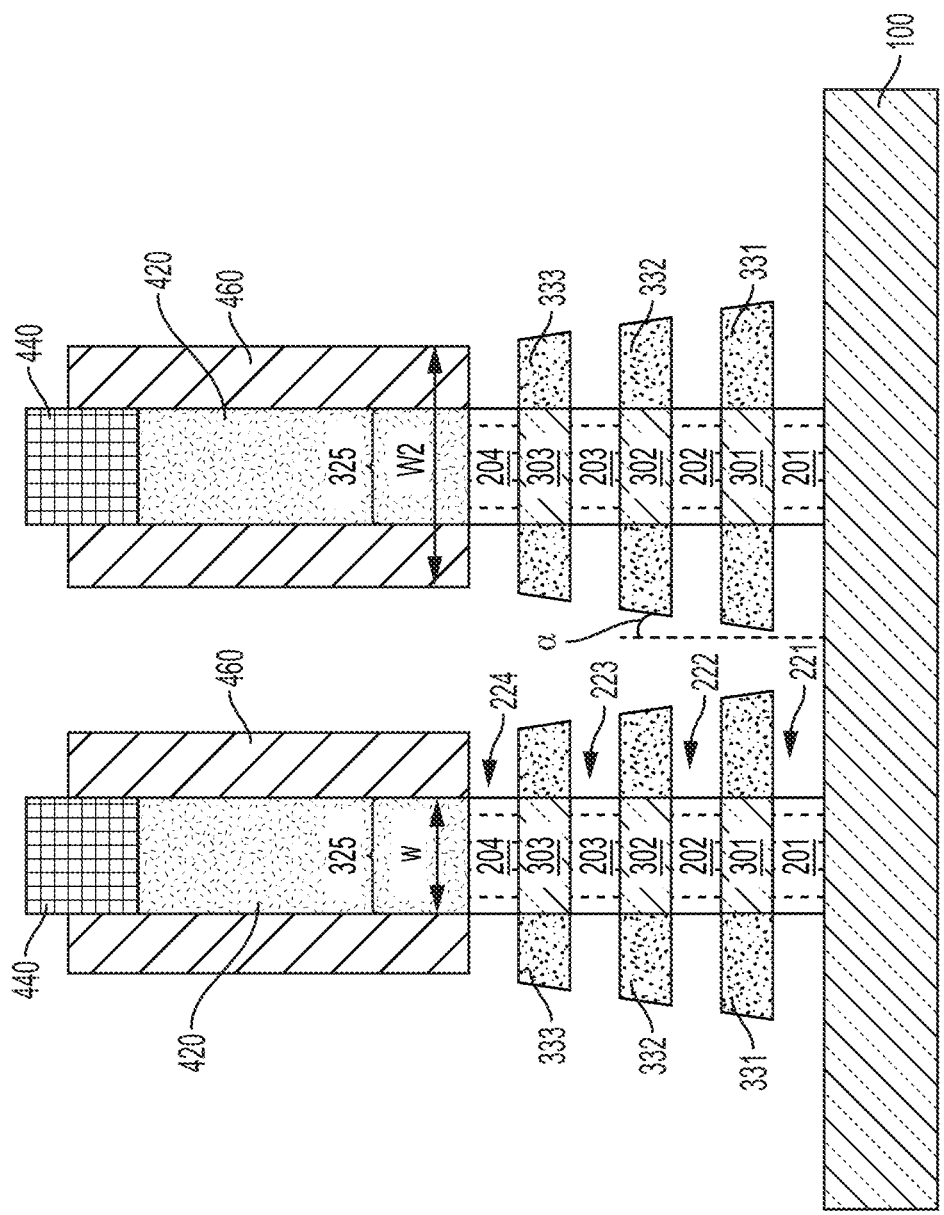
FIG. 6 depicts extension doping of the silicon layers outside of the channel regions thereof.

Referring to FIG. 6, the semiconductor epitaxial layers 301, 302, 303 are doped outside of channel regions 325 thereof to form extension regions 331, 332, 333. That is, the semiconductor epitaxial layers 301, 302, 303 are doped in regions laterally spaced from sacrificial gate layer 420 and underlying sidewall spacers 460. In certain embodiments, the extension regions are uniformly doped.

Doped regions may be formed by adding dopant atoms to an intrinsic semiconductor. This changes the electron and hole carrier concentrations of the intrinsic semiconductor at thermal equilibrium. A doped region may be p-type or n-type. As used herein, "p-type" refers to the addition of impurities to an intrinsic semiconductor that creates a deficiency of valence electrons. For silicon, example p-type dopants, i.e., impurities, include but are not limited to boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. The dopant(s) may be introduced by ion implantation or plasma doping. Portions of the semiconductor epitaxial layers 301, 302, 303 underlying sacrificial gate layer 420, i.e., within channel regions 325, may remain undoped. Extension regions 331, 332, 333 provide a conductive path between the channels and later-formed source/drain junctions.

Figure 7:
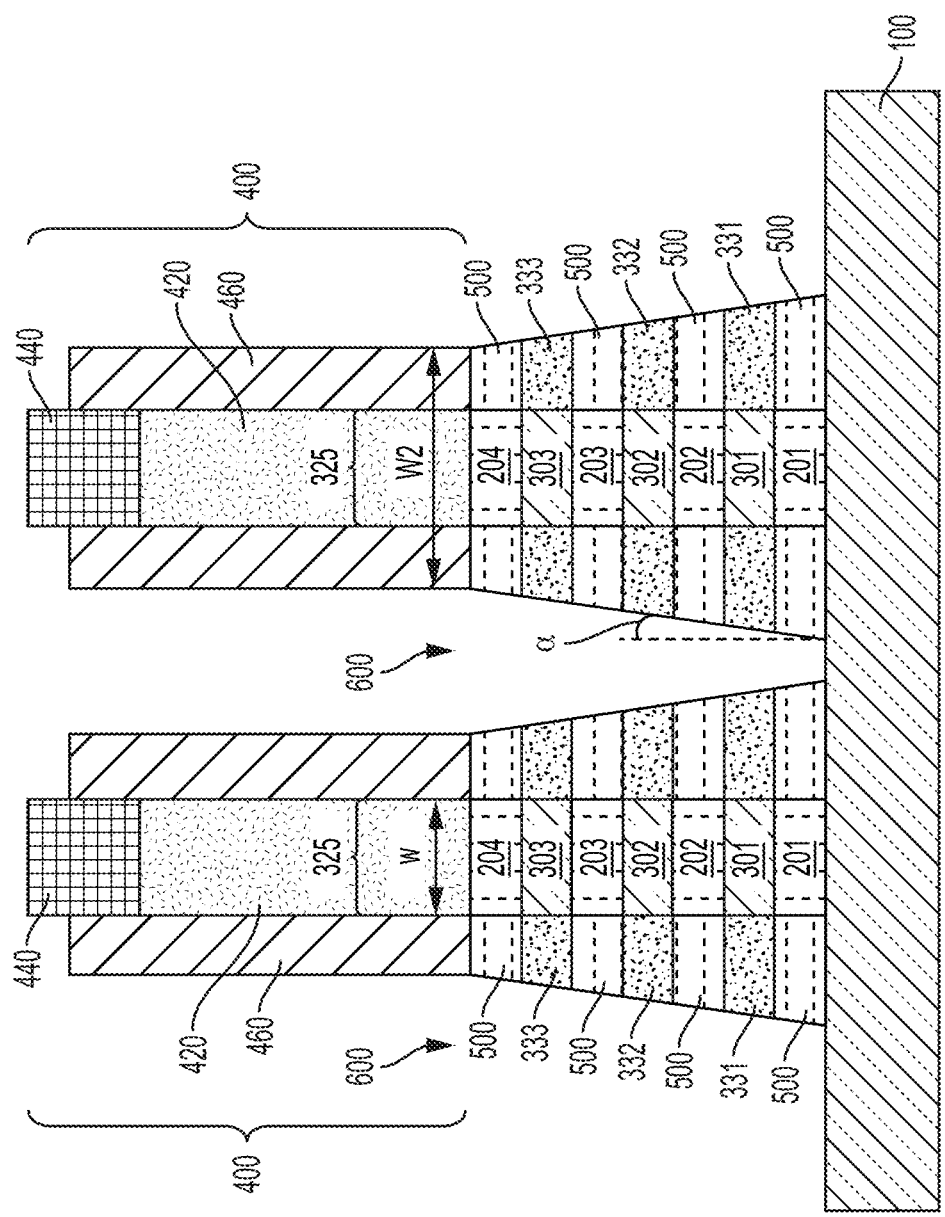
FIG. 7 shows the structure of FIG. 6 following inner spacer deposition between the doped layers of silicon.

Turning to FIG. 7, following the formation of extension regions 331, 332, 333, inner spacers 500 are formed to re-fill the recessed regions 221, 222, 223, 224 created by the recess etch of the sacrificial layers 201, 202, 203, 204. Inner spacers 500 may be formed using a conformal ALD or CVD deposition process followed by an isotropic etch back. In connection with various embodiments, inner spacers 500 comprise a material that is etch selective to silicon germanium, such as silicon nitride, although inner spacers 500 may comprise other etch selective dielectric materials. As a result of the formation of the inner spacers 500, sidewalls surfaces of the extension regions 331, 332, 333 remain exposed, but the sacrificial layers 201, 202, 203, 204 are covered by the inner spacer material.

Figure 8:
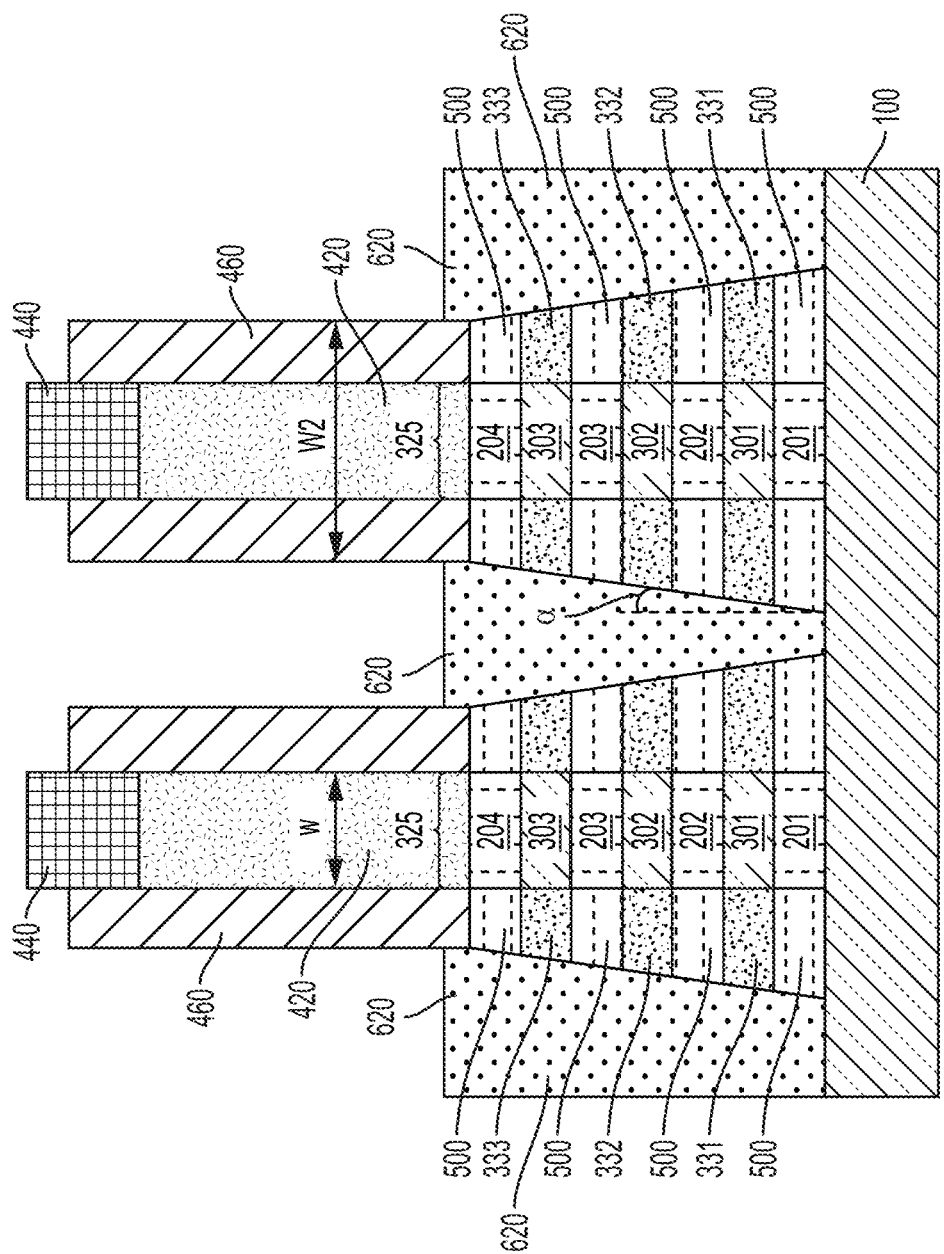
FIG. 8 depicts the formation of epitaxial source/drain junctions.

Thereafter, referring to FIG. 8, doped epitaxial source/drain junctions 620 are formed within source/drain recesses 600 by epitaxial growth from exposed portions of the semiconductor epitaxial layers 331, 332, 332. The epitaxial source/drain junctions 620 are electrically connected to semiconductor epitaxial layers 301, 302, 303 within the channel regions of the structure through the extension regions 331, 332, 333, but isolated from sacrificial layers 201, 202, 203, 204.

Figure 9:
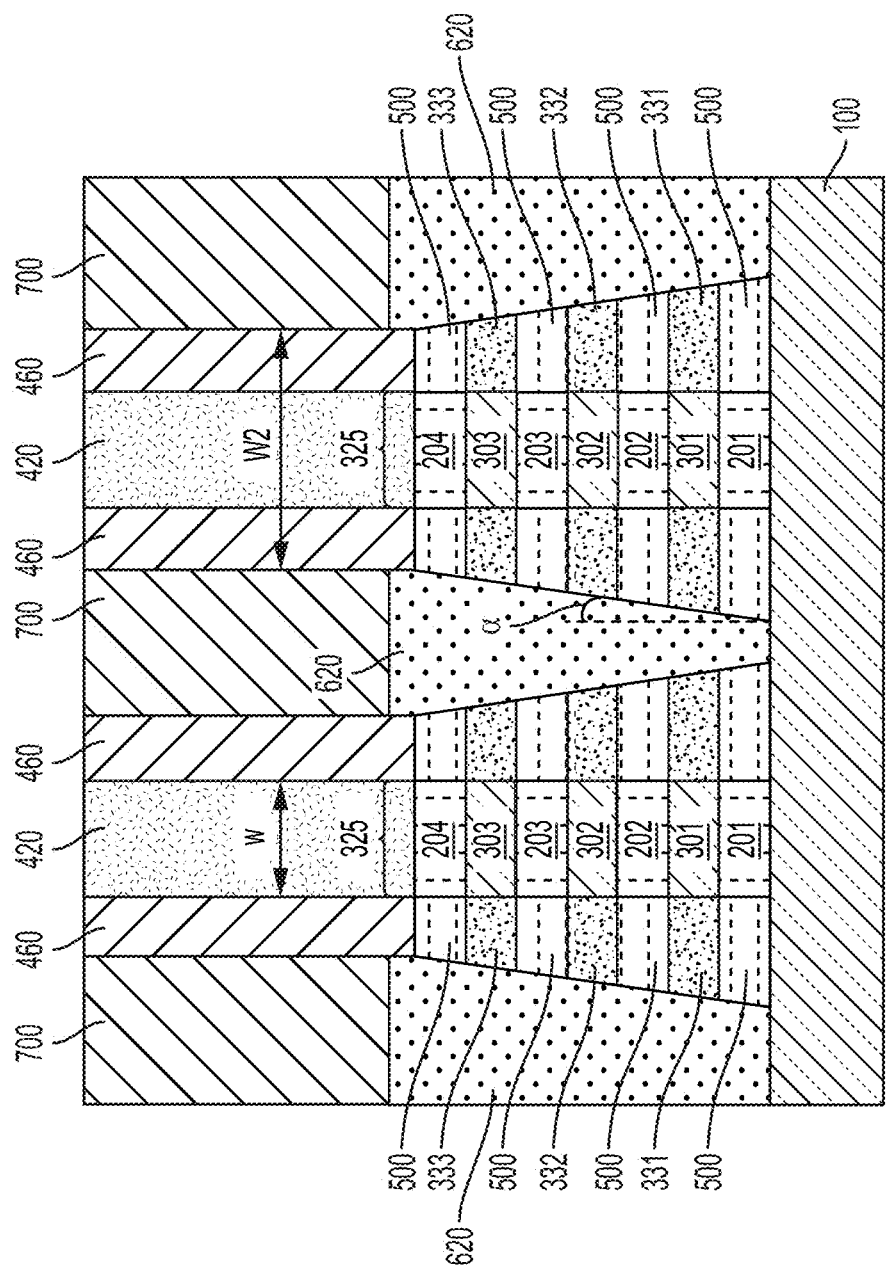
FIG. 9 is a post-planarization structure after formation of an interlayer dielectric over the epitaxial source/drain regions and between the sacrificial gate structures.

Referring to FIG. 9, an interlayer dielectric 700 is formed over the source/drain junctions 620 and between exposed sidewalls of the sidewall spacers 460. The ILD layer 700 may be formed using a CVD process and may comprise a low dielectric constant material. For example, the ILD layer 700 may comprise an oxide such as $SiO_2$, borophosphosilicate glass (BPSG), TEOS, undoped silicate glass (USG), fluorinated silicate glass (FSG), high-density plasma (HDP) oxide, or plasma-enhanced TEOS (PETEOS).

A CMP process may be used to remove the ILD overburden and planarize a top surface of the structure. "Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface. As seen in the illustrate embodiment of FIG. 9, the sacrificial gate layer 420 may serve as a CMP etch stop such that the CMP process removes the sacrificial gate cap 440.

Figure 10:
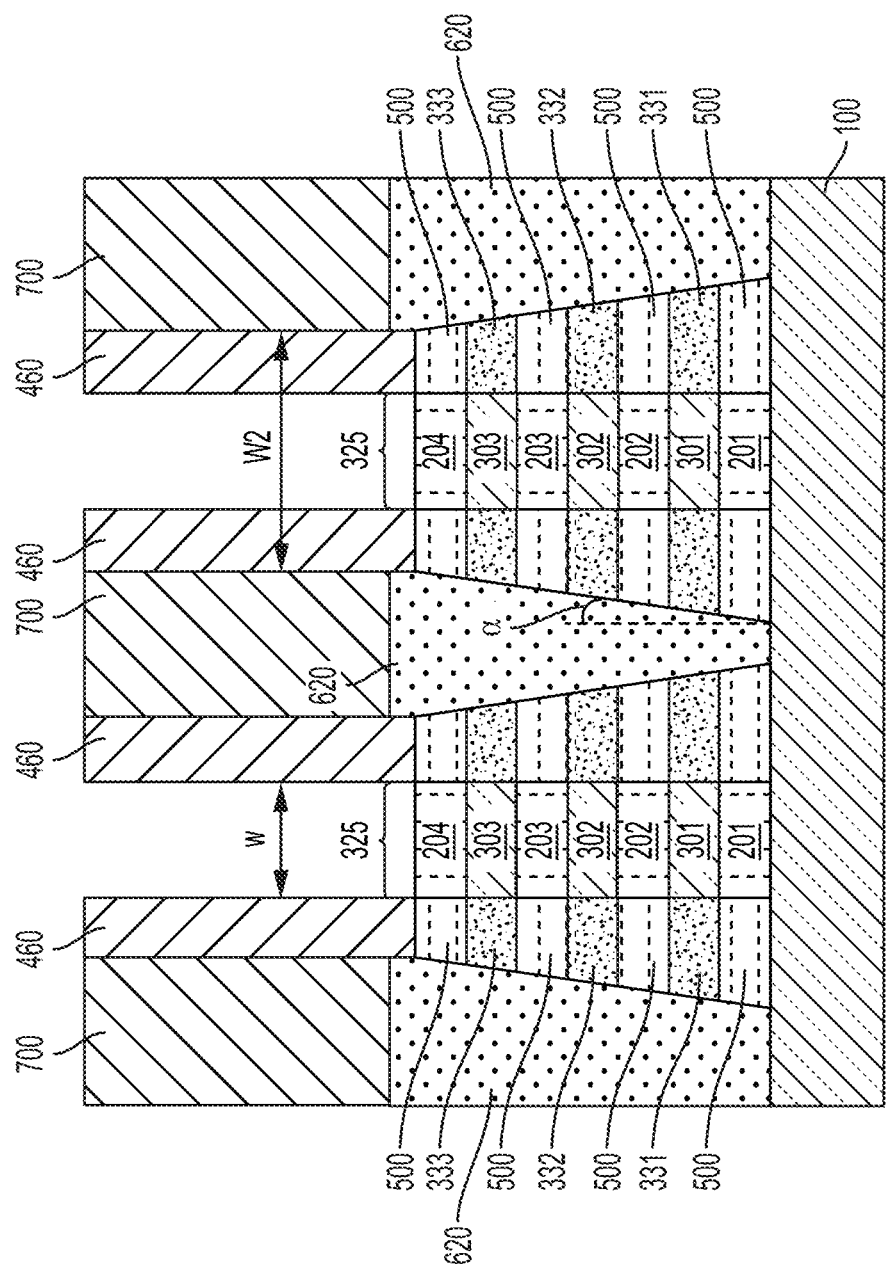
FIG. 10 shows removal of the sacrificial gate structures.

Thereafter, referring to FIG. 10, a selective etching step is used to remove the sacrificial gate layer 420. In embodiments where the sacrificial gate layer 420 comprises amorphous silicon, the sacrificial gate layer 420 can be etched and removed selectively with respect to silicon dioxide and silicon nitride using a wet etch chemistry comprising, for example, hot ammonia or TMAH.

Figure 11:
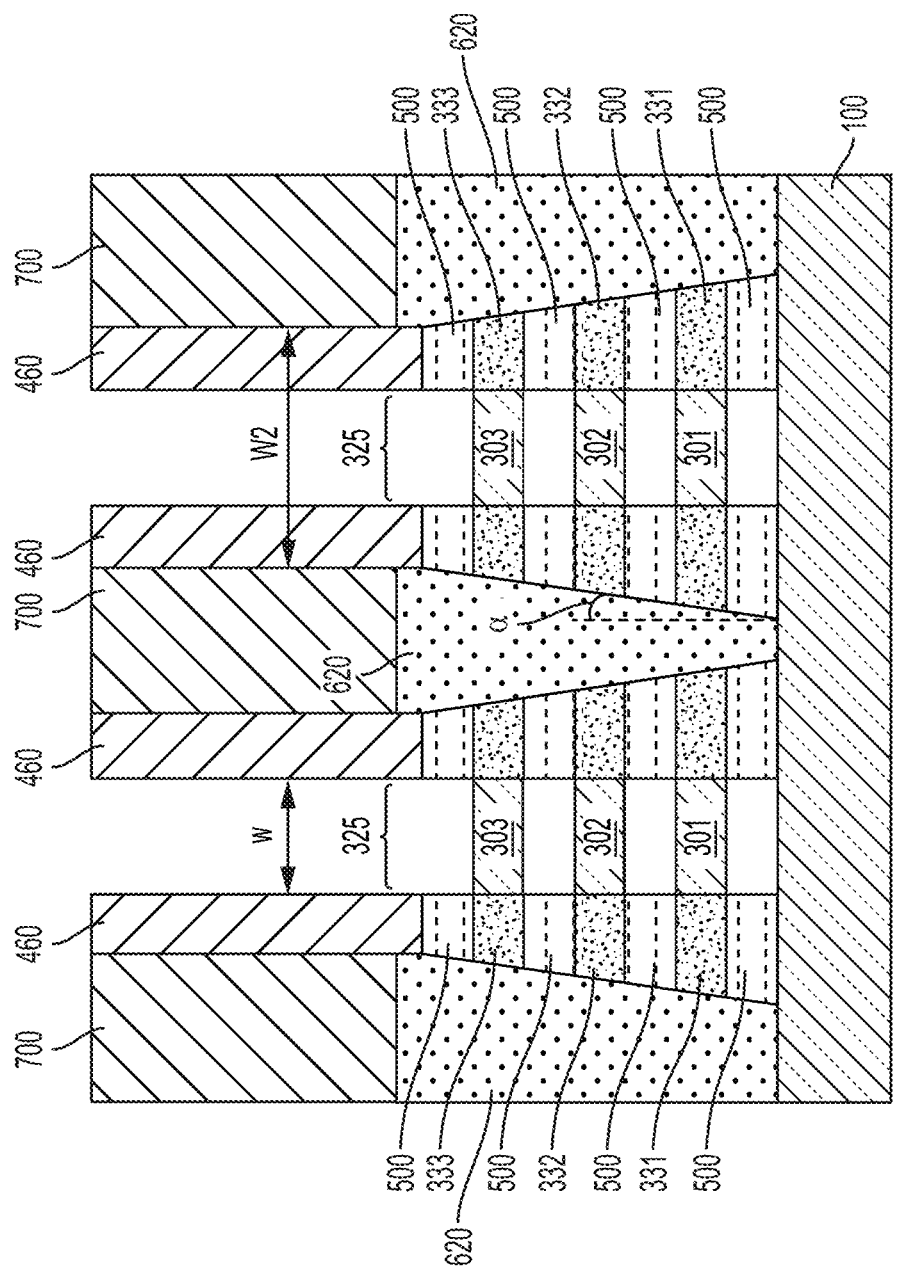
FIG. 11 depicts selective removal of the silicon germanium epitaxial layers to expose the channel regions of the silicon layers.

Referring to FIG. 11, subsequent to removal of the sacrificial gate layer 420, remaining portions of the sacrificial SiGe layers 201, 202, 203, 204 are removed selective to the semiconductor layers 301, 302, 303. During removal of the SiGe layers, inner spacers 500 and ILD layer 700 cooperate to protect the source/drain junctions 620, which may comprise SiGe.

Figure 12:
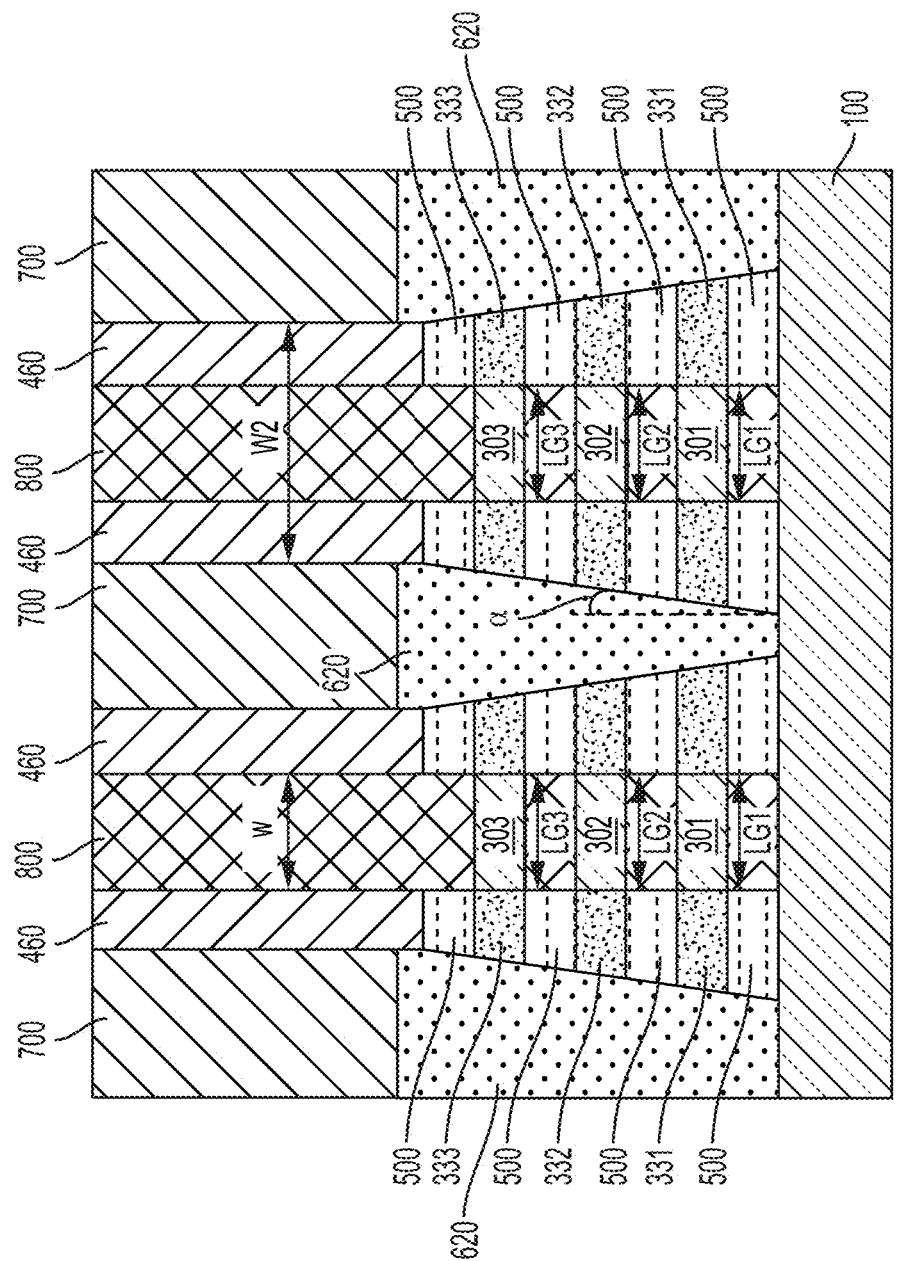
FIG. 12 shows the formation of a gate all around (GAA) gate architecture over the exposed channel regions.

Referring to FIG. 12, after revealing nano-dimensional semiconductor layers 301, 302, 303, a functional gate structure 800 including gate dielectric and gate conductor layers (not separately shown) is deposited into the voids previously occupied by the sacrificial SiGe material to contact multiple surfaces of each nanostructure. The effective gate lengths (LG1, LG2, LG3) within the illustrated structure are substantially equal.

A semiconductor structures disclosed herein may include one or more transistors, with each device including a source, drain, channel and gate. Moreover, it will be appreciated that although the various methods described herein relate to exemplary gate all around FET structures, such methods are not limited to a particular device architecture and may be used in conjunction with any other type of device or structure now known or later developed.

The methods described herein may be used, for example, for the fabrication of integrated circuit (IC) chips. The resulting integrated circuit chips can be distributed by the fabricator in raw wafer form, i.e., as a single wafer that has multiple unpackaged chips, as a bare die, or in packaged form. In the latter case, the chip may be mounted in a single chip package such as a plastic carrier, with leads that are affixed to a motherboard or other higher level carrier, or in a multichip package such as a ceramic carrier that has either or both surface interconnections or buried interconnections. In any case, the chip may then be integrated with other chips, discrete circuit elements, and/or other signal processing devices as part of either an intermediate product, such as a motherboard, or an end product. The end product can be any product that includes integrated circuit chips, ranging from toys and to advanced computer products having a central processor, a display, and a keyboard or other input device.

As used herein, the singular forms "a," "an" and "the" include plural referents unless the context clearly dictates otherwise. Thus, for example, reference to a "silicon nanosheet" includes examples having two or more such "nanosheets" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a nanosheet that comprises silicon include embodiments where a nanosheet consists essentially of silicon and embodiments where a nanosheet consists of silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of fabricating a device, comprising:
    forming a stack of alternating layers of epitaxial silicon germanium and epitaxial silicon over a semiconductor substrate;
    patterning the stack of alternating layers of epitaxial silicon germanium and epitaxial silicon to form a fin; and
    forming a sacrificial gate structure over the fin, wherein each successive layer of silicon germanium has a germanium content that is less than that of a previously-formed layer of silicon germanium.

2. The method of claim 1, wherein the fin has a first width (W1) measured orthogonal to a width of the sacrificial gate structure of 6 to 100 nm and a second width (W2) measured parallel to the width of the sacrificial gate structure of 25 to 65 nm.

3. The method of claim 1, wherein a first layer of silicon germanium is formed directly over the substrate.

4. The method of claim 1, wherein a first layer of silicon germanium has a germanium content of 35 to 50 atomic percent.

5. The method of claim 1, wherein each successive layer of silicon germanium has a germanium content that is 2 to 5 atomic percent less than that of the previously-formed layer of silicon germanium.

6. The method of claim 1, wherein a topmost epitaxial layer in the stack comprises silicon germanium.

7. The method of claim 1, wherein the layers of epitaxial silicon are undoped.

8. The method of claim 1, further comprising forming sidewall spacers over sidewalls of the sacrificial gate structure and over a portion of a top surface of the fin.

9. The method of claim 8, further comprising using the sidewall spacers and the sacrificial gate structure as an etch mask to etch exposed portions of the stack, wherein sidewalls of the stack after etching the exposed portions are inclined at an angle (α) relative to a direction orthogonal to a major surface of the substrate, where 0<α≤15°.

10. The method of claim 8, further comprising removing the silicon germanium layers from under the sidewall spacers to form recessed regions.

11. The method of claim 10, further comprising forming dielectric inner spacers within the recessed regions.

12. The method of claim 10, wherein remaining portions of the silicon germanium layers have a substantially equal width.

13. The method of claim 1, further comprising forming epitaxial source/drain regions laterally adjacent to the fin.

14. The method of claim 1, further comprising removing the sacrificial gate structure from over the fin to form an opening and removing the epitaxial silicon germanium layers beneath the opening selective to the epitaxial silicon layers, wherein exposed portions of the epitaxial silicon layers define channel regions of the device.

15. The method of claim 14, wherein the channel regions have a substantially constant width.

16. A method of fabricating a device, comprising:
    forming a stack of alternating layers of epitaxial silicon germanium and epitaxial silicon over a semiconductor substrate, wherein each successive layer of silicon germanium has a germanium content that is 2 to 5 atomic percent less than that of a previously-formed layer of silicon germanium;
    forming a sacrificial gate structure over the stack of alternating layers;
    forming sidewall spacers over sidewalls of the sacrificial gate structure;
    etching the stack of alternating layers using the sacrificial gate structure and the sidewall spacers as an etch mask to form a fin having tapered sidewalls; and
    removing the silicon germanium layers from under the sidewall spacers to form recessed regions, wherein remaining portions of the silicon germanium layers have a substantially equal width.

17. The method of claim 16, wherein each epitaxial layer of silicon is disposed between an underlying layer of epitaxial silicon germanium and an overlying layer of epitaxial silicon germanium.

18. The method of claim 16, wherein the layers of epitaxial silicon germanium comprise 20 to 50 atomic percent germanium.

* * * * *